United States Patent
Hopf

(10) Patent No.: US 10,541,646 B2
(45) Date of Patent: Jan. 21, 2020

(54) DISCONNECTION APPARATUS FOR A PHOTOVOLTAIC STRING, SOLAR INSTALLATION AND OPERATING METHOD FOR A SOLAR INSTALLATION WITH A PHOTOVOLTAIC STRING

(71) Applicant: SMA Solar Technology AG, Niestetal (DE)

(72) Inventor: Markus Hopf, Espenau (DE)

(73) Assignee: SMA Solar Technology AG, Niestetal (DE)

( * ) Notice: Subject to any disclaimer, the term of this patent is extended or adjusted under 35 U.S.C. 154(b) by 0 days.

(21) Appl. No.: 16/028,836

(22) Filed: Jul. 6, 2018

(65) Prior Publication Data

US 2018/0316308 A1    Nov. 1, 2018

Related U.S. Application Data

(63) Continuation of application No. PCT/EP2017/050865, filed on Jan. 17, 2017.

(30) Foreign Application Priority Data

Jan. 18, 2016   (DE) ................ 10 2016 100 758

(51) Int. Cl.
*H02S 40/36*    (2014.01)
*H02S 50/00*    (2014.01)
(Continued)

(52) U.S. Cl.
CPC ........ *H02S 40/36* (2014.12); *H01L 31/02021* (2013.01); *H02H 7/20* (2013.01);
(Continued)

(58) Field of Classification Search
CPC ... H01L 31/02021; H02S 40/32; H02S 40/36; H02S 50/00; H02H 7/20; H02J 3/383; H02J 13/0003; Y04S 10/123; H04B 3/548
See application file for complete search history.

(56) References Cited

U.S. PATENT DOCUMENTS

| | | | | |
|---|---|---|---|---|
| 4,742,291 A | * | 5/1988 | Bobier ...................... | H02J 7/35 136/293 |
| 5,012,113 A | * | 4/1991 | Valentine ............... | H04B 10/11 136/291 |

(Continued)

FOREIGN PATENT DOCUMENTS

| | | |
|---|---|---|
| CN | 105071770 A | 11/2015 |
| DE | 102011050468 A1 | 11/2012 |

OTHER PUBLICATIONS

International Search Report dated Mar. 13, 2017 in connection with International Application PCT/EP2017/050865.

*Primary Examiner* — Golam Mowla
(74) *Attorney, Agent, or Firm* — Eschweiler & Potashnik, LLC

(57) ABSTRACT

A description is given of an apparatus for disconnecting an electrical connection between solar modules of a photovoltaic string, the apparatus including a first and a second terminal for a respectively assigned solar module of the photovoltaic string, also a circuit breaker, a band-stop filter and a supply circuit for supplying energy to the apparatus, which are arranged in a series circuit with respect to one another between the first and second terminals. A bandpass filter for coupling out a high-frequency control signal from the electrical connection bridges the circuit breaker and the band-stop filter in parallel. In this case, a reverse current diode that is oppositely polarized relative to an operating current flow direction is connected in parallel with the (Continued)

circuit breaker or the partial series circuit comprising the circuit breaker and the band-stop filter.

13 Claims, 6 Drawing Sheets

(51) Int. Cl.
  H02J 3/38        (2006.01)
  H01L 31/02       (2006.01)
  H02J 13/00       (2006.01)
  H04B 3/54        (2006.01)
  H02H 7/20        (2006.01)
  H02S 40/32       (2014.01)
(52) U.S. Cl.
  CPC .......... *H02J 3/383* (2013.01); *H02J 13/0003* (2013.01); *H02S 50/00* (2013.01); *H04B 3/548* (2013.01); *H02S 40/32* (2014.12); *Y02E 10/563* (2013.01); *Y02E 40/72* (2013.01); *Y04S 10/123* (2013.01)

(56) References Cited

U.S. PATENT DOCUMENTS

| | | | | |
|---|---|---|---|---|
| 5,235,266 A * | 8/1993 | Schaffrin | B63H 21/17 | 136/293 |
| 5,268,832 A * | 12/1993 | Kandatsu | G05F 1/67 | 323/299 |
| 5,604,430 A * | 2/1997 | Decker | G05F 1/67 | 136/293 |
| 5,677,833 A * | 10/1997 | Bingley | H02M 7/49 | 136/293 |
| 5,923,158 A * | 7/1999 | Kurokami | G05F 1/67 | 323/299 |
| 6,275,016 B1 * | 8/2001 | Ivanov | H02M 3/158 | 323/224 |
| 6,448,489 B2 * | 9/2002 | Kimura | H02J 7/35 | 136/244 |
| 6,545,211 B1 * | 4/2003 | Mimura | H01L 31/02021 | 136/244 |
| 6,650,031 B1 * | 11/2003 | Goldack | G08B 13/1418 | 307/149 |
| 6,844,739 B2 * | 1/2005 | Kasai | G05F 1/67 | 323/284 |
| 6,894,911 B2 * | 5/2005 | Telefus | H02M 3/156 | 323/222 |
| 6,927,955 B2 * | 8/2005 | Suzui | H02H 3/337 | 361/42 |
| 6,984,970 B2 * | 1/2006 | Capel | G05F 1/67 | 323/299 |
| 7,061,214 B2 * | 6/2006 | Mayega | H02M 3/155 | 323/267 |
| 7,256,566 B2 * | 8/2007 | Bhavaraju | G05F 1/67 | 320/101 |
| 7,462,955 B2 * | 12/2008 | McNamara | H02J 3/005 | 307/64 |
| 7,602,080 B1 * | 10/2009 | Hadar | H02J 3/385 | 307/20 |
| 8,212,408 B2 * | 7/2012 | Fishman | H02J 3/36 | 307/43 |
| 8,325,059 B2 * | 12/2012 | Rozenboim | G08C 19/00 | 136/243 |
| 8,344,548 B2 * | 1/2013 | Stern | H02S 10/00 | 307/77 |
| 8,461,508 B2 | 6/2013 | Seymour | | |
| 8,773,236 B2 * | 7/2014 | Makhota | H04L 67/12 | 340/2.7 |
| 8,860,241 B2 * | 10/2014 | Hadar | H04B 3/548 | 307/1 |
| 8,952,672 B2 * | 2/2015 | Kernahan | H01L 31/02021 | 323/285 |
| 9,780,550 B2 * | 10/2017 | Hopf | H01L 31/02021 | |
| 2003/0010373 A1 * | 1/2003 | Tsuzuki | H01L 31/02021 | 136/244 |
| 2006/0162772 A1 * | 7/2006 | Presher, Jr. | H02J 7/35 | 136/251 |
| 2006/0174939 A1 * | 8/2006 | Matan | G05F 1/67 | 136/243 |
| 2006/0185727 A1 * | 8/2006 | Matan | H01L 31/02021 | 136/244 |
| 2008/0121272 A1 * | 5/2008 | Besser | G05F 1/67 | 136/248 |
| 2008/0238372 A1 * | 10/2008 | Cintra | H01M 10/052 | 320/137 |
| 2008/0303503 A1 * | 12/2008 | Wolfs | G05F 1/67 | 323/301 |
| 2009/0141522 A1 * | 6/2009 | Adest | H02J 1/102 | 363/55 |
| 2009/0322161 A1 * | 12/2009 | Patel | H02H 3/18 | 307/131 |
| 2010/0300508 A1 | 12/2010 | Maier | | |
| 2011/0025130 A1 * | 2/2011 | Hadar | H01L 31/02021 | 307/80 |
| 2011/0210610 A1 * | 9/2011 | Mitsuoka | H01L 31/02021 | 307/51 |
| 2011/0260866 A1 | 10/2011 | Avrutsky | | |
| 2012/0044014 A1 * | 2/2012 | Stratakos | H02J 3/383 | 327/530 |
| 2012/0187768 A1 * | 7/2012 | Goder | H02J 1/10 | 307/82 |
| 2012/0194003 A1 | 8/2012 | Schmidt | | |
| 2012/0199172 A1 * | 8/2012 | Avrutsky | H03K 17/082 | 136/244 |
| 2012/0242321 A1 * | 9/2012 | Kasai | G01J 5/0066 | 324/72 |
| 2012/0253541 A1 * | 10/2012 | Arditi | H02J 1/102 | 700/298 |
| 2012/0255591 A1 * | 10/2012 | Arditi | H01L 31/02021 | 136/244 |
| 2013/0026839 A1 * | 1/2013 | Grana | H02J 1/10 | 307/71 |
| 2013/0026840 A1 * | 1/2013 | Arditi | H02J 1/10 | 307/77 |
| 2013/0026842 A1 * | 1/2013 | Arditi | H02J 1/10 | 307/82 |
| 2013/0106402 A1 | 5/2013 | Deboy | | |
| 2013/0313909 A1 | 11/2013 | Storbeck | | |
| 2014/0307811 A1 | 10/2014 | Han | | |
| 2014/0327313 A1 * | 11/2014 | Arditi | H01L 31/02021 | 307/63 |
| 2015/0028679 A1 * | 1/2015 | Francescutto | H02J 3/383 | 307/63 |
| 2016/0099573 A1 | 4/2016 | Hopf | | |
| 2016/0156308 A1 * | 6/2016 | Alon | H02S 40/34 | 136/244 |
| 2019/0089148 A1 * | 3/2019 | Hopf | H02H 7/20 | |

\* cited by examiner

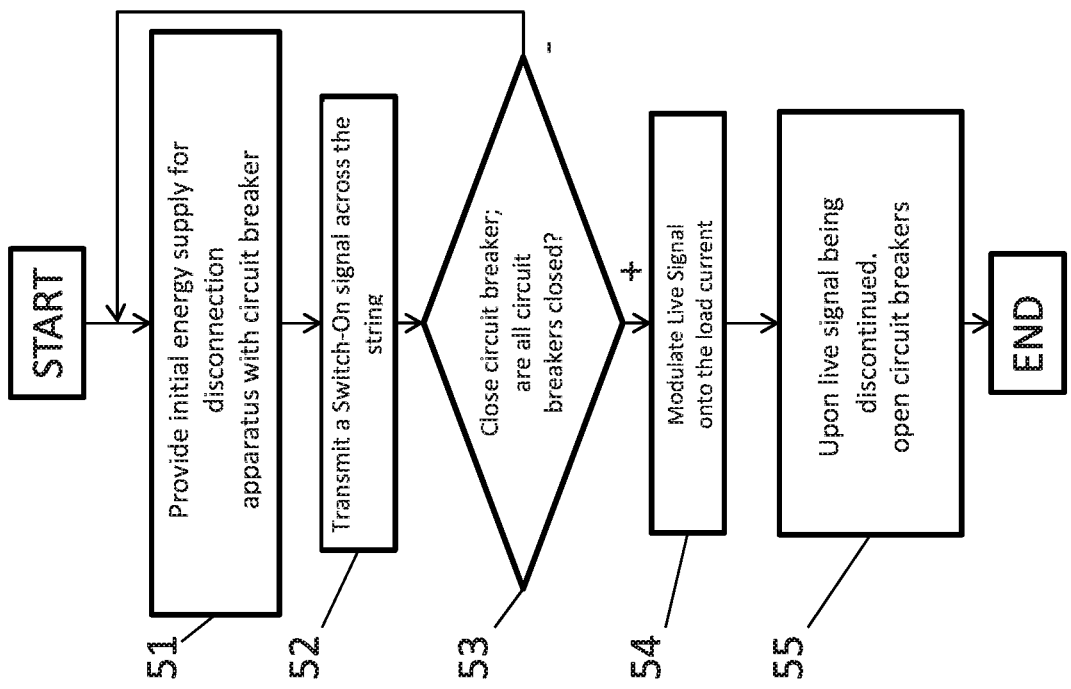

DISCONNECTION APPARATUS FOR A PHOTOVOLTAIC STRING, SOLAR INSTALLATION AND OPERATING METHOD FOR A SOLAR INSTALLATION WITH A PHOTOVOLTAIC STRING

CROSS REFERENCE TO RELATED APPLICATIONS

This application is a continuation of International Patent Application number PCT/EP2017/050865, filed on Jan. 17, 2017, which claims priority to German Patent Application number 10 2016 100 758.7, filed on Jan. 18, 2016, and is hereby incorporated by reference in its entirety.

FIELD

The disclosure relates to a disconnection apparatus for a photovoltaic string, and to a solar installation comprising a disconnection apparatus of this type. Furthermore, the disclosure relates to an operating method for a solar installation with a photovoltaic string, by means of which the disconnection apparatus is drivable.

BACKGROUND

In solar installations sunlight is converted into alternating current, which can be made available to consumers for example by being fed into a grid. For this purpose, a series circuit of solar modules, referred to hereinafter as a string or a photovoltaic (PV) string, is often connected to a DC input of inverters. By virtue of the series circuit, the string can have a high voltage precisely under intensive insolation, with the result that safety measures have to be implemented in order to ensure, particularly in a fault or hazard situation, that the highest potential difference dropped across the string between two arbitrary points of the string or between one arbitrary point of the string and the ground potential does not exceed a predefined limit value. In this regard, safety standards may prescribe, for example, that in a hazard or fault situation firstly the inverter is disconnected from the grid, and secondly, within a predefined time duration of a few seconds, the highest potential difference dropped across the string is not permitted to exceed the open circuit voltage of an individual solar module, for example 80 V.

While solar installations comprising module inverters in which only a single solar module is connected to the DC input of each inverter fulfill this standard in a manner governed by their design, additional measures are required in the case of string inverters. In this regard, it is known that the standard can be achieved by each solar module being short-circuited, or by a connection line of each solar module being electrically connected to the ground potential. An interruption of all connecting lines between solar modules of a string also leads to compliance with the safety standard in a known manner.

FIG. 1 shows a schematic illustration of a solar installation 1 according to the prior art, wherein the connecting line between adjacent solar modules 4 of a PV string 2 can be connected to ground potential via a drivable switching element 10. An inverter 3 can transmit a close signal to the switching elements 10 via a connecting line 11 if a hazard or fault situation is present, as a result of which at least the inner solar modules of the PV string 2 are short-circuited. Cumulatively or alternatively thereto, it is likewise possible for a connecting line between outer solar modules 4 of the PV string 2 and the inverter 3 to be connected to the ground potential via corresponding switching elements 10 (not illustrated in FIG. 1). In these embodiments, the power supply of the switching elements 10 is likewise effected by the inverter 3. What is disadvantageous here is that additional lines are required for the signal transmission and power supply, and also the necessity of having to design the switching elements 10 for the entire string voltage and the entire string current.

FIG. 2 shows a schematic illustration of a further solar installation 1 according to the prior art. Here each solar module 4 of a PV string 2 is assigned a protective circuit 20, which can be accommodated for example in a connection box of the solar module 4. The protective circuit 20 has an input 23 for connecting a solar module 4 assigned to the protective circuit 20 and an output 24 for connecting further series-interconnected solar modules 4 of the PV string 2. The protective circuit furthermore has a circuit breaker 21, which is arranged between the input 23 and the output 24 of the protective circuit 20 and is able to establish or interrupt an electrical connection between the input 23 and the output 24. Cumulatively or alternatively to the circuit breaker 21, the protective circuit 20 has a short-circuiting switch 22, which is arranged in parallel with the output 24 and which is able to short-circuit the solar module 4 with the circuit breaker 21 closed and to provide a bypass path for the current of the adjacent solar modules 4 within the PV string 2. Energy can be supplied to the protective circuit 20 by energy being drawn from the solar modules 4, with the result that autonomous operation of the protective circuit 20 is possible. At the same time, a drive signal for the protective circuit 20 can be transmitted for example by high-frequency modulation onto the DC string current via the string line (Power Line Communication—PLC). The signal generation can be effected by the inverter 3 to which the PV string 2 is connected. This obviates the need to provide additional lines for the operation of the protective circuit 20 within the solar installation 1. Details concerning the further embodiment of such a protective circuit can be gathered from the document WO 2011/023732 A1.

What is disadvantageous about the protective circuit 20 in accordance with FIG. 2 is the outlay for retrofitting an existing installation, and also the integration of the protective circuit 20 into the connection box of the solar module 4, since a bewilderingly large number of connection boxes exist and the space requirement of the protective circuit 20 or other integration requirements regularly cannot be fulfilled.

Furthermore, the document DE 10 2007 032 605 A1 generally discloses a drivable disconnection box for arrangement between photovoltaic modules. The disclosure says nothing, however, inter alia regarding a supply of the circuit and a process for starting up an installation with disconnected photovoltaic modules.

The document DE 10 2011 050 468 A1 also describes a photovoltaic installation for generating electrical energy with a plurality of photovoltaic modules connected in series. In that case, a switching device is arranged between at least two adjacent photovoltaic modules, by means of which switching device the electrical connection between the adjacent photovoltaic modules can be interrupted.

The document DE 10 2013 106 808 A1 discloses a circuit arrangement for the inline voltage supply of an electrical or electronic device arranged in the region of a line carrying a direct current. The circuit arrangement comprises a parallel circuit comprising two antiparallel-oriented diodes arranged in the line. The voltage dropped across the antiparallel diodes is tapped off by a supply subcircuit. A semiconductor switch for minimizing the power loss of the circuit arrangement can be connected in parallel with the antiparallel diodes.

Finally, the document DE 10 20112 104383 A1 discloses a switching unit for arrangement in a DC line between photovoltaic modules interconnected in series. In that case, a switching element of the switching unit is configured to reduce a current flow of the photovoltaic modules in the DC line. To that end, the switching unit comprises a transmission element in order to couple out an electrical control signal present on the DC line and to control the switching element solely with the energy of the coupled-out control signal. In this case, a coupling element is arranged in parallel with the switching element, which coupling element, with the switching element being nonconductive, conducts the control signal through the switching unit. However, precisely in the case of a large number of series-connected photovoltaic modules or switching units, it is disadvantageous that a significant amount of energy is drawn from the control signal for the energy supply and control of the switching element and, if appropriate, further components of the switching unit. In this regard, on the one hand, only a relatively small power can be transmitted with tenable outlay via the control signal serving primarily for signal transmission. On the other hand, it must be ensured that even after power has been drawn from the control signal and after an associated reduction of the corresponding signal level, the control signal is still reliably received by all the switching units.

SUMMARY

The present disclosure is directed to a disconnection apparatus for a photovoltaic string, which disconnection apparatus requires no additional lines within the solar installation and can easily be integrated into existing solar installations. In this case, the intention is to ensure a reliable energy supply of the disconnection apparatus even in the case of a large number of disconnection apparatuses within the string. Furthermore, the disclosure is directed to a corresponding solar installation and an operating method for a solar installation with a PV string interrupted by disconnection apparatuses of this type, with which a simple start-up of the solar installation is possible.

According to the disclosure, an apparatus for disconnecting an electrical connection between solar modules of a photovoltaic string comprises a first and a second terminal for connection respectively to a different solar module of the photovoltaic string, and also a circuit breaker, a band-stop filter and a supply circuit for supplying energy to the disconnection apparatus, which are arranged in a series circuit with respect to one another between the first and second terminals. A bandpass filter for coupling out a high-frequency control signal from the electrical connection bridges the circuit breaker and the band-stop filter in parallel. A control unit is configured to receive the control signal and to operate the disconnection apparatus depending on the control signal. In this case, a diode that is oppositely polarized relative to an operating current flow direction, the diode being referred to hereinafter as reverse current diode, is connected in parallel with the circuit breaker. In this configuration, a reverse current can flow through the string even with the circuit breaker open. Likewise, the reverse current diode can also be connected in parallel with a partial series circuit comprising the circuit breaker and the band-stop filter and can jointly bridge these two elements. In this case, the reverse current diode can be a separate component, or can be formed by an intrinsic diode of a first semiconductor switch arranged in parallel with the circuit breaker. By virtue of the supply circuit, the apparatus becomes energy-autonomous and can itself ensure its power supply with the aid of the voltage drop at the supply circuit. If appropriate, besides the disconnection apparatus, further electrical components not assigned to the disconnection apparatus can also be supplied with electrical power. This is advantageous for example if the components are situated in spatial proximity to the disconnection apparatus. At the same time, via the bandpass filter, an AC voltage of suitable frequency can be transmitted between the terminals even with a circuit breaker open. In the case of the disconnection apparatus according to the disclosure, the electrical power for supplying the disconnection apparatus and, if appropriate, the further electrical components is substantially drawn from a direct current flowing between the first and second terminals. It is therefore not necessary to draw a significant portion of electrical power for the energy supply of the disconnection apparatus from the control signal and thereby to attenuate the control signal. Although it is still possible to draw power from the control signal for supply purposes, this then serves to support the already existing supply and can thus be reduced to a minimum.

In one advantageous embodiment of the disclosure, the circuit breaker is a double contact series relay, wherein a monitoring circuit is furthermore connected to a midpoint of the double contact series relay in one embodiment. In this way, the operational reliability of the apparatus is increased because a reliable disconnection of the terminals is ensured even if one of the contacts of the double contact series relay does not open properly. Via the monitoring circuit it is possible to detect this fault situation and, if appropriate, react suitably thereto. Alternatively or supplementarily, the monitoring circuit can also detect the occurrence of an arc at one of the contacts and quench it by temporarily diverting the current around the affected contact. In addition, the monitoring circuit can also prevent a switching arc from arising by means of a temporary diversion of the current, the diversion being brought about deliberately, as early as before a switching process of the circuit breaker.

The power demand of the apparatus is reduced if the circuit breaker is a bi-stable relay because then power is required only at the instants of the actuation of the relay, while a power for holding a switching state that was set by a switching process carried out previously is obviated. If appropriate, an energy store should be provided, from which the circuit breaker is actuated in order to ensure that the circuit breaker still opens reliably in the event of failure of the energy supply.

In principle, however, the circuit breaker can be embodied not only as a relay but also as a semiconductor switch or as a series-interconnected combination of the two. The use of a semiconductor switch as circuit breaker is employed in one embodiment if a galvanic isolation of the terminals with the circuit breaker open is not required. With the use of semiconductor switches as circuit breaker, it is also possible to use switches which have a lower reverse voltage by comparison with the maximum string voltage by virtue of said switches being equipped with a protective circuit that temporarily short-circuits the semiconductor switches when a voltage exceeding a limit value is present. If a galvanic isolation is required, however, it is desirable in one embodiment to use relays as circuit breaker, and the bandpass filter should also be designed as a galvanically isolating bandpass filter, e.g. by means of a series capacitor contained therein.

Advantageously, a first semiconductor switch for avoiding a switching arc is connected in parallel with the circuit breaker in one embodiment. Upon or before opening of the circuit breaker, the first semiconductor switch is temporarily put into the conducting state, such that the current commutates to the first semiconductor switch for a sufficiently long time and cannot cause an arc upon the opening of the circuit breaker. After the opening of the circuit breaker, the first semiconductor switch is put into the non-conducting state again and thus interrupts the current commutated to it. Alternatively, the first semiconductor switch can also be connected in parallel with a partial series circuit comprising the circuit breaker and the band-stop filter and can jointly bridge these two elements.

In one embodiment of the disclosure, the supply circuit comprises an extra-low-voltage apparatus. A DC/DC converter, for example a boost converter, is connected to the extra-low-voltage apparatus and configured to convert a voltage dropped across the extra-low-voltage apparatus into a suitable supply voltage for the disconnection apparatus, if appropriate also for further electrical components.

In one embodiment the extra-low-voltage apparatus has two antiparallel-connected diodes. By virtue of this circuit, the maximum voltage dropped across the extra-low-voltage apparatus is limited or largely independent of the load current between the terminals of the disconnection apparatus. In addition, the extra-low-voltage apparatus is thus bidirectionally functional independently of whether a current in the operating current direction or a reverse current counter to the operating current direction is present.

Furthermore, in one embodiment a second semiconductor switch can be connected in parallel with the extra-low-voltage apparatus in order to keep down the voltage drop or the power losses associated therewith by means of the second semiconductor switch being wholly or at least partly closed if the full voltage drop across the extra-low-voltage apparatus is not required to supply the disconnection apparatus with energy. The second semiconductor switch can also be switched back and forth between two switching states, e.g. open and closed. In one embodiment, an intrinsic diode of the second semiconductor switch forms a constituent part of the extra-low-voltage apparatus, such that the second semiconductor switch can also be part of the extra-low-voltage apparatus.

In a further aspect of the disclosure, a solar installation comprises an inverter and a photovoltaic string comprising at least two series-connected solar modules, the photovoltaic string being connected to the inverter, a disconnection apparatus described above being arranged between said solar modules. In one embodiment, if the photovoltaic string comprises more than two solar modules, a disconnection apparatus described above is arranged in each case between two adjacent solar modules. If the safety standard in a fault situation allows a maximum voltage within the string that corresponds to a multiple of an open circuit voltage of a solar module, for example double the open circuit voltage, it is not necessary for a respective disconnection apparatus to be arranged between each of the solar modules. Rather, groups of corresponding magnitude, for example pairs, of directly connected solar modules can be arranged in the string, which are respectively isolated from one another by a disconnection apparatus.

In yet another aspect of the disclosure, an operation method for a solar installation comprising an inverter and a photovoltaic string comprising at least two series-connected solar modules, the photovoltaic string being connected to the inverter, a disconnection apparatus described above being arranged between the solar modules, comprises providing an initial energy supply for the open disconnection apparatus by impressing a current flow via the string and drawing energy from the impressed current flow. This is followed by transmitting a switch-on signal via the string, which leads to closing of a circuit breaker of the disconnection apparatus in reaction to the transmitted switch-on signal. Even after the closing of the circuit breaker of the disconnection apparatus, energy is supplied to the disconnection apparatus by the current flow via the string, which then, however, is no longer impressed but rather generated by the solar modules. When providing the initial energy supply for the open disconnection apparatus, impressing the current flow is realized by impressing a reverse current via the string. For this purpose, a voltage that exceeds the open circuit voltage of the string is applied to the string. Such a voltage can be generated for example by a link circuit capacitor of the inverter being charged from the grid to a specific DC voltage—for example a grid peak voltage or double the latter. If the DC voltage at the link circuit capacitor is below or far above the open circuit voltage of the string, then a DC/DC converter—for example a bidirectionally operable DC/DC converter of the inverter that is arranged between the link circuit capacitor and the string—can correspondingly boost or step down the DC voltage in order to impress a desired reverse current via the string.

If the disconnection apparatus is closed, in one embodiment of the method according to the disclosure, a live signal is transmitted repeatedly or permanently via the string, wherein the disconnection apparatus remains closed as long as the live signal is transmitted, and opens upon the live signal being discontinued.

The live signal can be discontinued by the actuation of a manual safety switch or else by the identification of a fault or hazard situation by components of the solar installation. The discontinuation of the live signal can be implemented even in the case of disconnection from the grid. In this case, it is unimportant whether the live signal is generated by the inverter or some other component of the solar installation.

In one embodiment of the disclosure, in addition to impressing the reverse current, impressing the current flow is carried out by applying an AC voltage to the string having a first frequency. In this case, applying an AC voltage is taken to mean not only the electrical connection to an AC voltage source, but also other types of voltage generation such as inductive or capacitive coupling-in.

The live signal can be transmitted by applying an AC voltage having a second frequency different than the first frequency, but the second frequency can also be equal to the first frequency, which in one embodiment is effected at a frequency at which the AC voltage is conducted effectively and with low losses via the bandpass filter. In one embodiment, impressing the current flow is carried out by the inverter connected to the string. It is also conceivable, however, for a further component to be incorporated in the installation in addition to the inverter and the string, which further component performs the function of impressing the current flow and thus the initial energy supply of the disconnection apparatus. Transmitting the live signal is also carried out by the inverter in one embodiment, but can also be carried out by the additional component.

BRIEF DESCRIPTION OF THE DRAWINGS

The disclosure is explained below with the aid of figures, of which

FIG. 6 shows a flow diagram of an operating method according to the disclosure for a solar installation.

DETAILED DESCRIPTION

Figure 1:
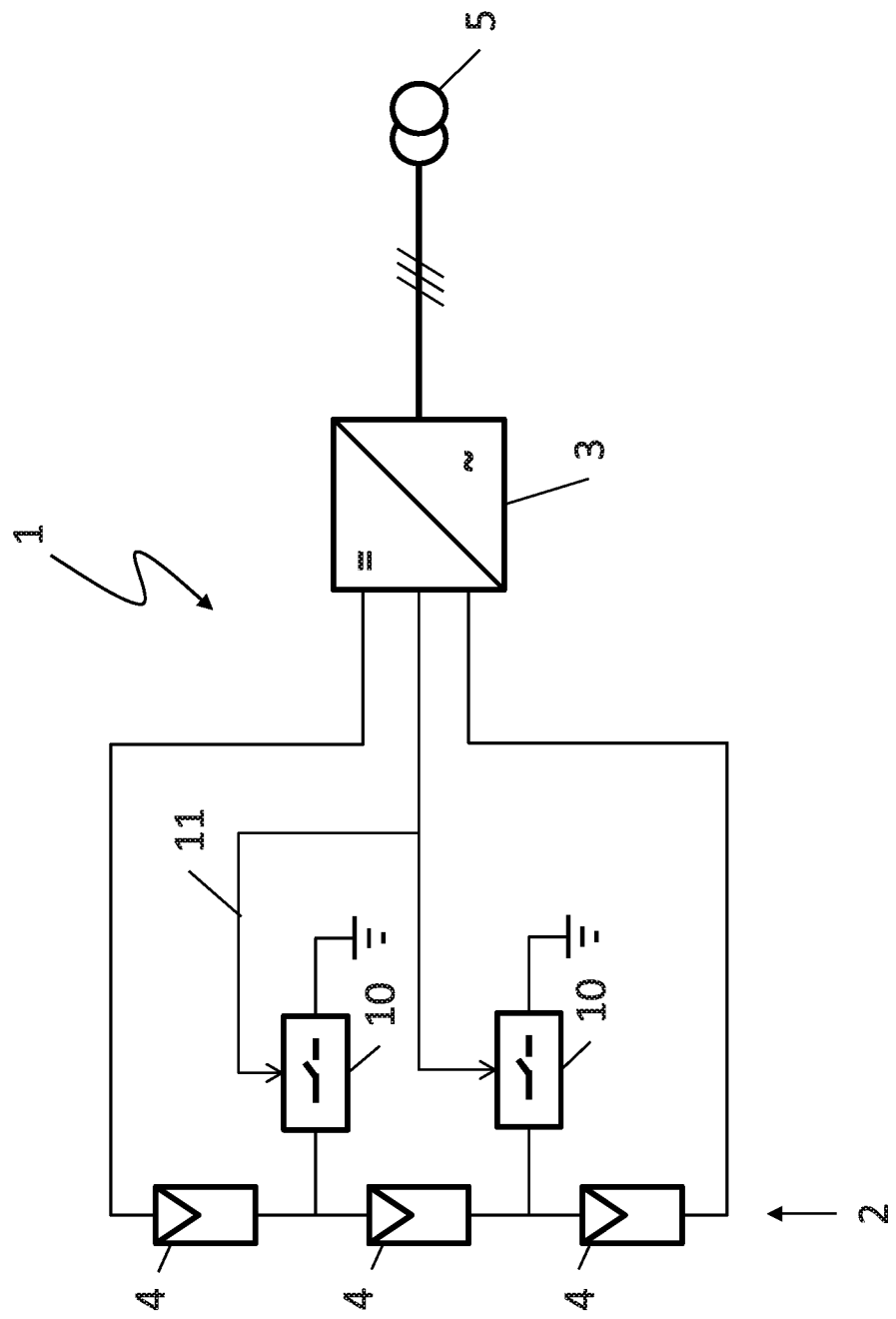
FIG. 1 shows a first previously known embodiment of a solar installation with switchable grounding within a string line.
Figure 2:
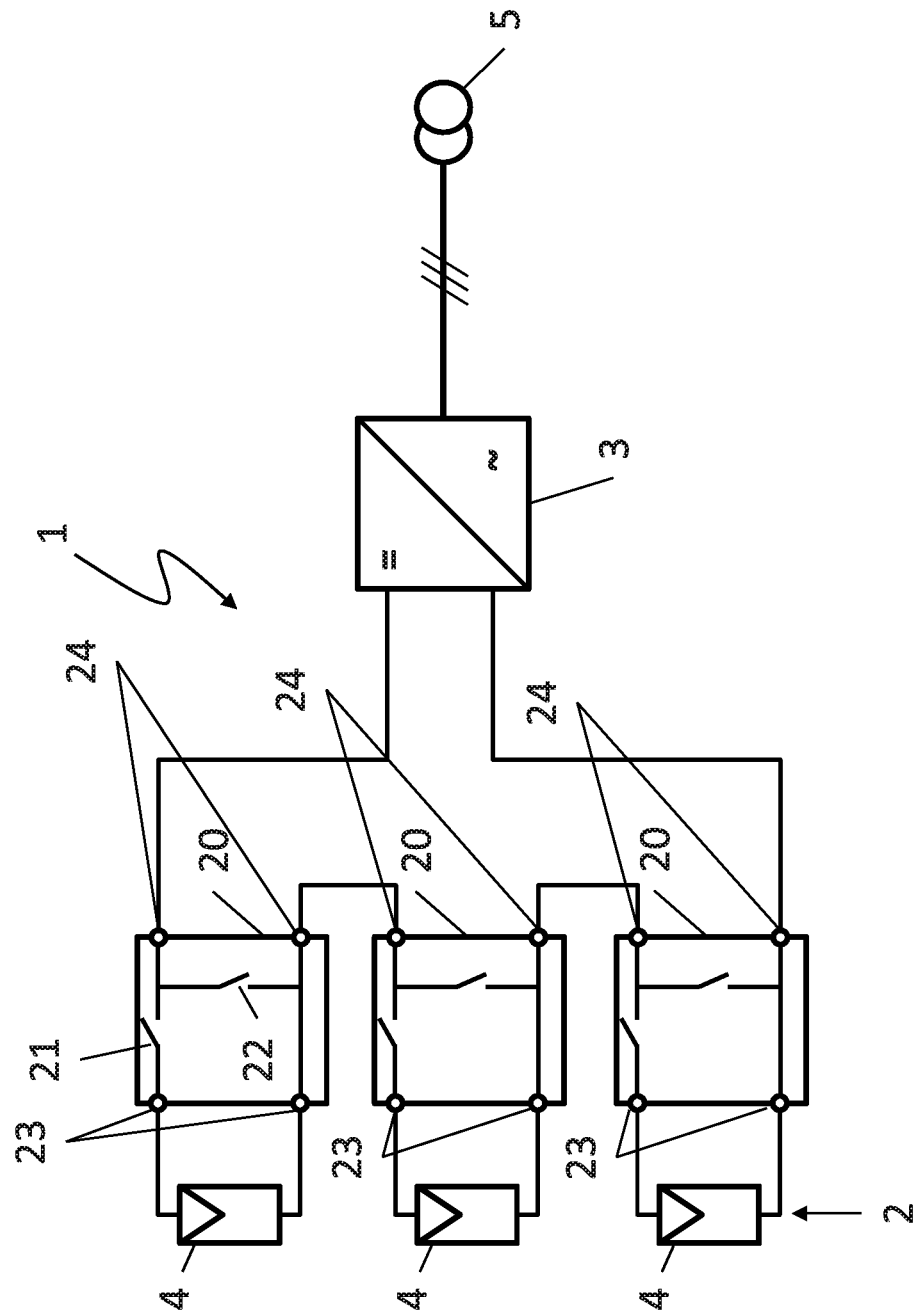
FIG. 2 shows a second previously known embodiment of a protective circuit for solar modules of a solar installation with PV string.
Figure 3:
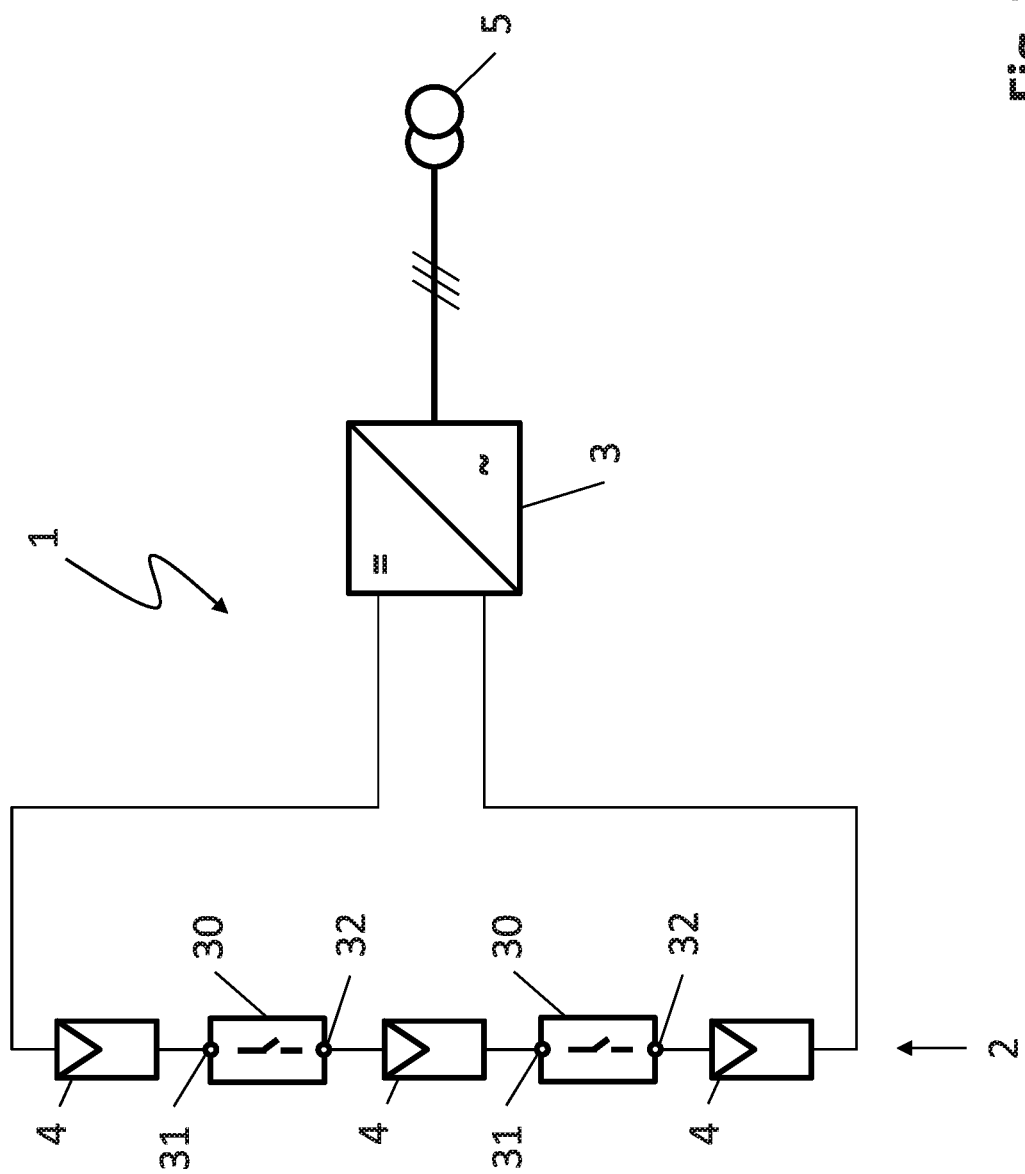
FIG. 3 shows a schematic illustration of a solar installation according to the disclosure comprising disconnection apparatuses within a string.

FIG. 3 shows a schematic construction of a solar installation 1 according to the disclosure comprising an inverter 3, to which a string 2 comprising a series circuit comprising a multiplicity of solar modules 4 is connected on the input side. The inverter 3 is connected to a grid 5 on the output side, here as a three-phase inverter. However, the inverter 3 can also be embodied as a single-phase or polyphase inverter 3. A disconnection apparatus 30 is arranged respectively between two of the solar modules 4. Each disconnection apparatus 30 can interrupt the series circuit of the solar modules 4 in this way by the opening of a drivable switching element contained in the disconnection apparatus. The disconnection apparatus 30 can be fitted at an arbitrary location of the connecting line of the assigned two solar modules 4. The disconnection apparatuses 30 can also be integrated subsequently by interrupting an existing connecting line between two adjacent solar modules 4 and connecting the interrupted ends of the connecting line to corresponding terminals 31, 32 of the disconnection apparatus 30. In this case, it is conceivable for connectors to be fitted to the interrupted ends, the connectors being inserted into corresponding mating connectors of the disconnection apparatus, or for the interrupted ends to be directly inserted into corresponding terminals 31, 32, and fixed, for example by clamping, soldering, screwing or by means of metallic cutting elements. FIG. 3 shows by way of example a string 2 comprising series-interconnected solar modules 4, wherein a respective disconnection apparatus 30 is arranged between two adjacent solar modules 4. In the general case of n solar modules 4 within the string according to one embodiment, (n−1) disconnection apparatuses 30 are thus required or otherwise employed. However, the number of required disconnection apparatuses 30 relative to the number n of solar modules 4 can also be reduced—depending on an allowed maximum voltage within the PV string 2—by groups of a plurality of solar modules 4 being connected to one another directly and without interposed disconnection apparatus 30. This is expedient for cost reasons as long as the solar modules 4 that are directly connected to one another do not exceed the allowed maximum voltage.

Figure 4:
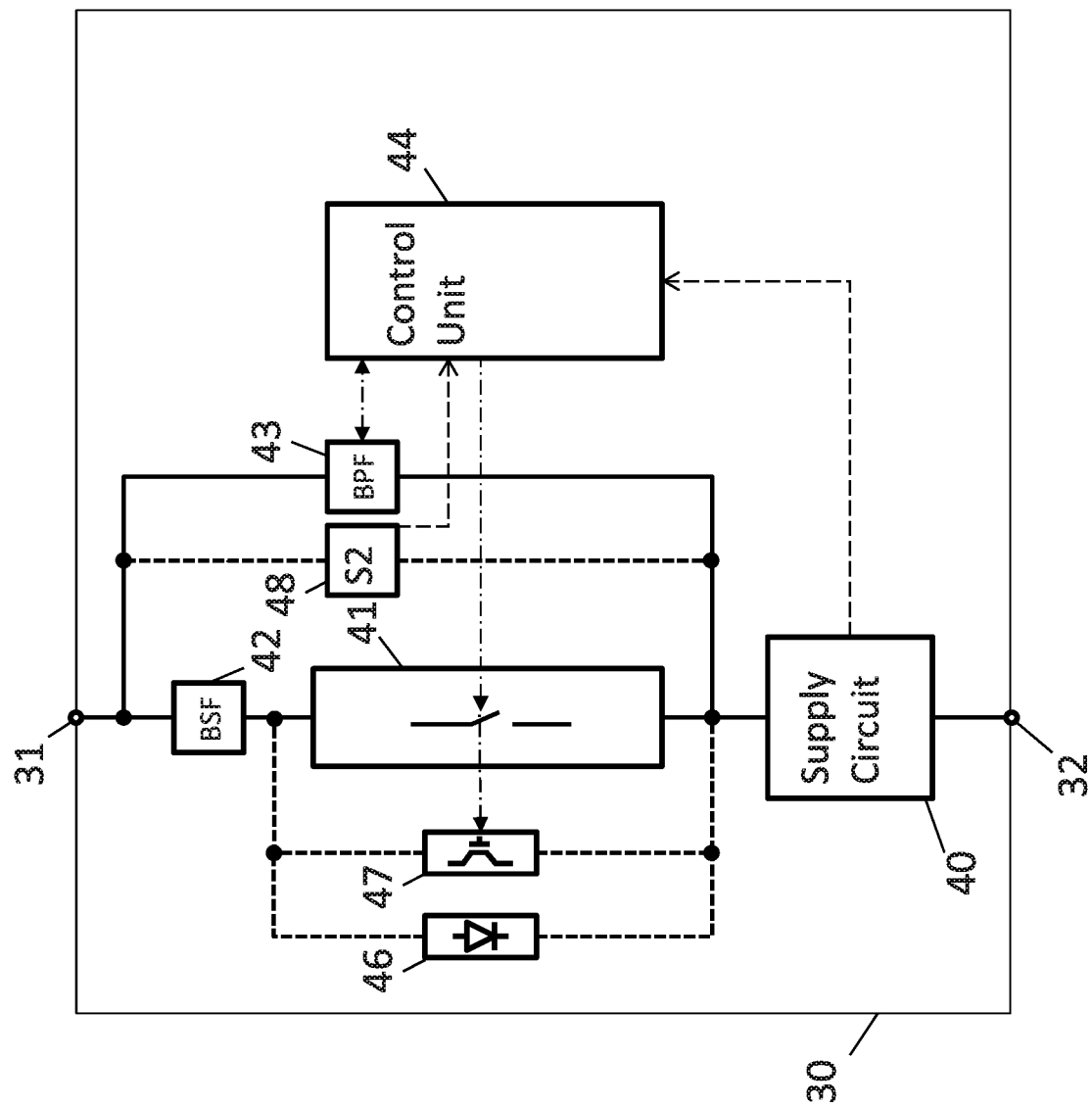
FIG. 4 shows a schematic construction of a disconnection apparatus according to the disclosure.

FIG. 4 shows a schematic construction of a disconnection apparatus 30 according to the disclosure. A series circuit comprising a band-stop filter (BSF) 42, a circuit breaker 41 and a supply circuit 40 is arranged between the first terminal 31 and the second terminal 32. A bandpass filter (BPF) 43 bridges the band-stop filter 42 and the circuit breaker 41, such that, with a closed but also with an open circuit breaker 41, an AC voltage signal transmitted via the terminals 31, 32 is conducted via the bandpass filter 43, coupled out and communicated to a control unit 44. The control unit 44 is configured for driving the circuit breaker 41 in reaction to the transmitted signal. A reverse current diode 46 and/or a first semiconductor switch 47 are/is connected in parallel with the circuit breaker 41. The reverse current diode 46 can be present as a separate component, or can be formed by the intrinsic diode of the first semiconductor switch 47. The first semiconductor switch 47 is likewise driven by the control unit 44 and can be used in particular for avoiding arcs in the circuit breaker 41.

The supply circuit 40 serves for supplying energy to the control unit 44 by virtue of the fact that, at least with the circuit breaker 41 closed, in the case of a current flowing between the terminals 31, 32, the supply unit brings about a suitable voltage drop and generates therefrom the energy required for the supply of the control unit 44. In a first variant of the disclosure, the supply circuit 40 is at the same time also configured to generate the energy required for the operation of the control unit 44, with the circuit breaker 41 open, from the AC voltage signal conducted via the bandpass filter 43. Alternatively, however, a second supply circuit (S2) 48 can also be connected in parallel with the bandpass filter 43, the second supply circuit 48 accepting part of the AC voltage signal and using it to supply energy to the control unit 44. A serial arrangement of the second supply circuit 48 and the bandpass filter 43 and also an embodiment in which the bandpass filter 43 and the second supply circuit 48 form a common component of the disconnection apparatus 30 according to the disclosure are conceivable, but not shown.

Figure 5:
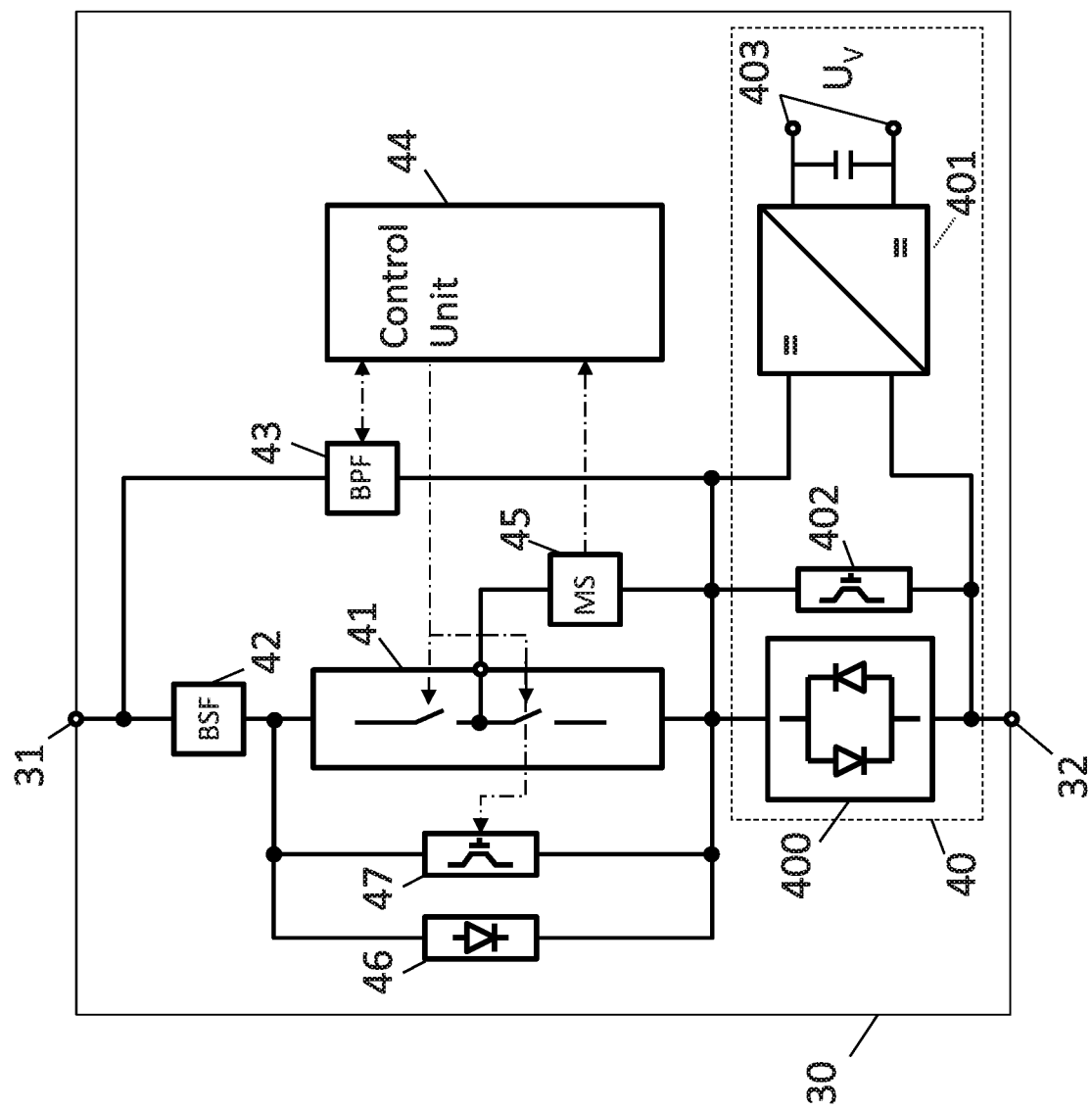
FIG. 5 shows one configuration of a disconnection apparatus according to the disclosure.

The construction of a disconnection apparatus 30 according to the disclosure is illustrated in greater detail in FIG. 5. The first terminal 31 is connected to the second terminal 32 of the disconnection apparatus 30 here in a series circuit via an extra-low-voltage apparatus 400, the circuit breaker 41 and the band-stop filter (BSF) 42. The series circuit constitutes the load current path via which a direct current of a string 2 into which the disconnection apparatus 30 is integrated flows if the circuit breaker 41 is closed. The bandpass filter (BPF) 43 is connected at one end to a side of the band-stop filter 42 facing away from the circuit breaker 41, and at the other end to a junction point between circuit breaker 41 and the extra-low-voltage apparatus 400, such that the bandpass filter 43 bridges the partial series circuit comprising circuit breaker 41 and band-stop filter 42. In one embodiment the bandpass filter 43 can be embodied as a series circuit comprising a capacitor and a coil. A control unit 44 is coupled to the bandpass filter 43 in order to receive a signal that is a frequency component of the string current which is tuned to the specific frequency of the bandpass filter/band-stop filter pair and which is transmitted between the first terminal 31 and the second terminal 32 via the bandpass filter 43, both with the circuit breaker open and with the circuit breaker closed. The control unit 44 is able to control the disconnection apparatus 30 in reaction to the signal, in particular to correspondingly actuate the circuit breaker 41. In this way, by means of Power Line Communication (PLC), the control unit 44 can be addressed in a targeted manner by a signal modulated onto the load current of the string 2 or can in turn modulate a response signal onto the load current and thus communicate bidirectionally with an inverter 3 to which the string 2 is connected.

In this embodiment, the extra-low-voltage apparatus 400 forms a constituent part of a supply circuit 40 for the operation of the disconnection apparatus 30. For this purpose, it is configured to produce a voltage drop which, on the one hand, is intended to be as low as possible, particularly in the case of a high load current with the circuit breaker 41 closed, since the voltage drop constitutes an, in principle, undesired power loss of the PV string 2. On the other hand, even at the lowest load currents of proper operation of the solar installation the voltage drop must be high enough so that sufficient power for the reliable supply of the disconnection apparatus can be generated therefrom. In one embodiment, for this purpose the extra-low-voltage apparatus comprises an antiparallel circuit comprising two diodes, in particular silicon diodes, such that a voltage drop in the region of 1V is generated, the voltage drop being as far as possible independent of the load current, as a result of which cost-effective low-voltage components can be used in the supply circuit 40. A DC/DC converter 401 is connected in parallel with the extra-low-voltage apparatus 400 in order to boost this relatively low voltage to a typical value of a supply voltage $U_V$, e.g. 5V, which is then present at the supply terminals 403 of the supply circuit 40 in order to supply the other components of the disconnection apparatus 30 with energy. In particular, the control unit 44 can be supplied via the supply voltage Uv present at the supply terminals 403 of the supply circuit 40. It is likewise possible for the supply terminals 403 of the disconnection apparatus 30 to be led toward the outside and to be made accessible from the outside, for example as separate terminals in a housing wall of the disconnection apparatus 30. In this way, even further electrical components that are not assigned to the disconnection apparatus, but are situated in spatial proximity to the disconnection apparatus, can be supplied with electrical power by the disconnection apparatus 30 or by the supply circuit 40 thereof.

In one advantageous embodiment of the disclosure, in addition a second semiconductor switch 402, for example a MOSFET, in particular a normally open MOSFET, for reducing the voltage drop is connected in parallel with the extra-low-voltage apparatus 40, and is wholly or partly switched on, in particular operated in linear operation with a constant voltage drop independent of the string current, whenever only a lower value of 300 mV, for example, rather than the voltage drop generated by the diodes, is required for generating the supply power. In this way, the power loss from the string 2 within the disconnection apparatus 30 can be reduced further. It lies within the scope of the disclosure for a second semiconductor switch 402 to comprise an intrinsic diode (i.e. a so-called body diode), wherein one of the antiparallel-interconnected diodes of the extra-low-voltage apparatus 400 can be embodied by the intrinsic diode of the second semiconductor switch 402. It is likewise possible, however, for two separate diodes to be interconnected in antiparallel despite an intrinsic diode of the second semiconductor switch 402 being present. This is expedient for example if an intrinsic diode present in the second semiconductor switch 402 does not bring about a desired voltage drop, whereas two separate antiparallel-interconnected diodes at least come closer to the desired voltage drop.

In one exemplary embodiment of the disclosure, the disconnection apparatus 30 requires a power of 30 mW for reliable operation. The string 2 of the solar installation 1 has a maximum current of 10 A and is intended to be kept in operation down to a string current of 100 mA. With a closed or linearly operated second semiconductor switch 402, that is to say a voltage drop of 300 mV, precisely the required power of 30 mW can thus be generated by means of the operation of the DC/DC converter 401 with a string current of 100 mA; if appropriate, the voltage drop can be temporarily or permanently increased by the opening of the second semiconductor switch 402. At the same time, with a maximum load current of 10 A, the power loss remains limited to 3 W(=10 A*300 mV).

In one embodiment, the circuit breaker 41 is embodied as a double contact series relay, in other words it has two relay contacts connected in series. This firstly increases the operational reliability of the disconnection apparatus 30 since even in the case where a contact of the circuit breaker 41 does not open for example on account of contact welding as a result of an arc that occurred previously, a reliable disconnection is nevertheless effected by the disconnection apparatus 30. At the same time, by connecting a midpoint between the two relay contacts to a monitoring circuit (MS) 45 it is possible for this case to be detected and reported further before the disconnection apparatus 30 becomes non-functional. For passing on the information about the state of the circuit breaker 41, the monitoring circuit 45 is, in one embodiment, connected to the control unit 44. Passing on this information from the control unit 44 to the inverter 3 can be carried out by means of power line communication (PLC). The inverter 3, for its part, can transmit this information to an operator of the PV installation by wire or by radio via a communication interface present in the inverter and can thus inform the operator about a risk state of the PV installation. If the monitoring circuit 45 detects that a contact of the circuit breaker 41 is not open, in contrast to a desired state, a single-fault safety of the arrangement is no longer ensured and closing of the circuit breaker 41 can be prevented by the controller 44.

In order to further reduce the power demand of the disconnection apparatus 30, it is advantageous to embody the circuit breaker 41 as a bi-stable relay, such that the circuit breaker 41 requires power only during the switching phases, but not for holding a switching state brought about previously. In order to ensure that the circuit breaker 41 opens automatically in the case of a fault or upon unexpected failure of the energy supply, it is advantageous to provide a capacitor for storing the energy required for the opening.

In order to avoid switching arcs, a first semiconductor switch 47 is connected in parallel with the circuit breaker 41. The first semiconductor switch 47 is switched on at the instant at which the circuit breaker 41 receives the signal for opening. Upon the opening of the contacts of the circuit breaker 41, the current commutates to the first semiconductor switch 47, such that an arc cannot arise in the circuit breaker 41 upon the opening of the contacts. As soon as the contacts are open, the first semiconductor switch 47 is likewise opened and the current, at least, however, a direct current portion of the current between the first terminal 31 and the second terminal 32, is interrupted.

In one embodiment of the disclosure, a reverse current diode 46 is furthermore connected in parallel with the circuit breaker 41, the diode being polarized in such a way that a current directed oppositely to the normal load current of the string 2 can flow through the disconnection apparatus 30 even with the circuit breaker 41 being open. This variant of the disclosure obtains particular importance in an operating method described further below for a solar installation in which a reverse current is driven through the string 2 temporarily for the initial energy supply of the disconnection apparatus 30.

An operating method according to the disclosure for a solar installation 1 is described as a flow diagram in FIG. 6.

In a starting state of this method it is assumed that the string 2 of the solar installation 1 described above is not yet producing energy and all the disconnection apparatuses 30 of the string 2 are in the open state. The isolation of the solar modules 4 of the string 2 among one another ensures that no point of the installation has a voltage that exceeds the open circuit voltage of one of the solar modules 4.

Act 51 then involves providing an initial energy supply for the disconnection apparatus 30 with the circuit breaker 41 open by virtue of a current flow being impressed on the string 2. The form of the current flow is chosen such that the current flows through the disconnection apparatus 30 of the string 2 despite the circuit breaker 41 being open. Upon the impressing of the current flow, a reverse current in the form of a direct current, for example, is impressed on the string 2, the current being directed oppositely to the normal current flow direction of the string. In this case, the current bypasses the open circuit breaker 41 via the reverse current diode 46 connected in parallel. In one embodiment, in addition to the reverse current it is possible to generate the current flow in the form of an alternating current having a first frequency by means of applying an AC voltage to the string having the first frequency, wherein the first frequency is chosen such that it can pass through the bandpass filter 43. Independently of the current form chosen—i.e. a reverse current e.g. in the form of a direct current, or an alternating current—it is conceivable for the inverter 3 to impress the current, or for an independent component to be integrated into the solar installation 1 for this purpose. In any case, the impressed current flows through the extra-low-voltage apparatus 400 of the respective disconnection apparatus 30 and generates there a voltage drop that is used via the possibly parallel-connected DC/DC converter 401 in order to provide the initial energy supply and to precharge an output capacitor between the supply terminals 403 of the supply circuit 40.

In one advantageous variant of the method, each disconnection apparatus 30 transmits, for example via its control unit 44, an individual PLC signal as soon as the initial energy supply has led to a sufficient supply state for the disconnection apparatus 30. The signal is received by the inverter 3 or the independent component and is used for choosing the duration of the initial energy supply phase, in particular by virtue of the following step being carried out only after an individual signal has been received from all disconnection apparatuses 30 of the string 2.

As soon as a voltage sufficient to operate the disconnection apparatus 30 is present at the supply terminals 403 of the supply circuit 40, in a second act 52 a switch-on signal is transmitted across the string via the inverter 3 or the independent component. In one embodiment, the switch-on signal can be transmitted as a PLC signal. In reaction to the transmitted switch-on signal, in a third act 53, the respective disconnection apparatuses 30 close their circuit breaker 41 and a check is made to ascertain whether all the circuit breakers 41 of the string 2 are closed (+). If this is the case, as a consequence the power generated by the solar modules 4 can flow as load current through the string 2 to the inverter 3, where it is converted into grid-conforming alternating current and fed into the connected grid 5. If one of the disconnection apparatuses 30 of the string 2 does not close its circuit breaker 41 (−), and the load current therefore does not flow, the procedure can be repeated with the first act 51, if appropriate with an extended initial energy supply phase.

As soon as the solar installation is in a normal operating state, the disconnection apparatuses 30 can be supplied further via the voltage drop caused in the extra-low-voltage apparatuses 400 by the load current. In this state, in a fourth act 54 of the method, a live signal, for example as PLC signal, for example from the inverter 3, is modulated onto the load current as a repeated signal or as a permanent signal. Alternatively, other signals or other signal generators, for example further installation components, can be used. The first frequency or a second frequency that is different from the first frequency can be used as the carrier frequency of a live signal in the form of an AC voltage. Upon the same, first frequency being chosen, the specific frequency of the bandpass/band-stop filter pair can be chosen, as a result of which minimum signal losses within the string 2 and hence reliable signal reception in the disconnection apparatuses 30 is possible even with a high number of solar modules 4 within the string 2.

As long as the live signal is received by the disconnection apparatuses 30, the circuit breakers 41 of the disconnection apparatuses 30 of the string 2 remain closed. Upon the live signal being discontinued, however, the disconnection apparatuses 30 independently open their circuit breaker 41 in act 55, as a result of which the load current of the string 2 is interrupted. In this way, all the solar modules 4 of the string 2 are electrically isolated from one another within a short time duration and the solar installation 1 is transferred to a safe state by falling below the limit value for the maximum voltage within the solar installation 1.

A renewed start-up of the solar installation 1 is carried out by renewed execution of the operating method according to the disclosure.

The invention claimed is:

1. An apparatus for disconnecting an electrical connection between solar modules of a photovoltaic string, comprising:
    a first terminal and a second terminal for a respectively assigned solar module of the photovoltaic string,
    a circuit breaker, a band-stop filter and a supply circuit arranged in a series circuit with respect to one another between the first and second terminals, wherein the supply circuit is configured to supply energy to the apparatus,
    a bandpass filter that bridges the circuit breaker and the band-stop filter in parallel, wherein the bandpass filter is configured to couple out a high-frequency control signal from the electrical connection, and
    a control unit configured to receive the high-frequency control signal and to operate the apparatus based on the high-frequency control signal,
    wherein a reverse current diode that is oppositely polarized relative to an operating current flow direction is connected in parallel with the circuit breaker or a partial series circuit comprising the circuit breaker and the band-stop filter.

2. The apparatus as claimed in claim 1, wherein the circuit breaker is a double contact series relay.

3. The apparatus as claimed in claim 2, further comprising a monitoring circuit connected to a midpoint of the double contact series relay.

4. The apparatus as claimed in claim 1, wherein the circuit breaker is a bi-stable relay.

5. The apparatus as claimed in claim 1, further comprising a first semiconductor switch connected in parallel with the circuit breaker or the partial series circuit comprising the circuit breaker and the band-stop filter, wherein the first semiconductor switch is configured to suppress a switching arc associated with the circuit breaker.

6. The apparatus as claimed in claim 1, wherein the supply circuit comprises:
    an extra-low-voltage apparatus having two antiparallel-connected diodes, and a DC/DC converter connected to the extra-low-voltage apparatus and configured to convert a voltage dropped across the extra-low-voltage apparatus into a supply voltage for the apparatus.

7. The apparatus as claimed in claim 6, further comprising a second semiconductor switch connected in parallel with the extra-low-voltage apparatus.

8. A solar installation comprising an inverter and a photovoltaic string comprising at least two series-connected solar modules, said photovoltaic string being connected to the inverter, wherein an apparatus is arranged between the solar modules, the apparatus comprising:
   a first terminal and a second terminal for a respectively assigned solar module of the photovoltaic string,
   a circuit breaker, a band-stop filter and a supply circuit arranged in a series circuit with respect to one another between the first and second terminals, wherein the supply circuit is configured to supply energy to the apparatus,
   a bandpass filter that bridges the circuit breaker and the band-stop filter in parallel, wherein the bandpass filter is configured to couple out a high-frequency control signal from the electrical connection, and
   a control unit configured to receive the high-frequency control signal and to operate the apparatus based on the high-frequency control signal,
   wherein a reverse current diode that is oppositely polarized relative to an operating current flow direction is connected in parallel with the circuit breaker or a partial series circuit comprising the circuit breaker and the band-stop filter.

9. An operating method for a solar installation comprising an inverter and a photovoltaic string comprising at least two series-connected solar modules, the photovoltaic string being connected to the inverter, an apparatus being arranged between the solar modules, the apparatus comprising:
   a first terminal and a second terminal for a respectively assigned solar module of the photovoltaic string,
   a circuit breaker, a band-stop filter and a supply circuit arranged in a series circuit with respect to one another between the first and second terminals, wherein the supply circuit is configured to supply energy to the apparatus,
   a bandpass filter that bridges the circuit breaker and the band-stop filter in parallel, wherein the bandpass filter is configured to couple out a high-frequency control signal from the electrical connection, and
   a control unit configured to receive the high-frequency control signal and to operate the apparatus based on the high-frequency control signal,
   wherein a reverse current diode that is oppositely polarized relative to an operating current flow direction is connected in parallel with the circuit breaker or a partial series circuit comprising the circuit breaker and the band-stop filter the operating method comprising:
   providing an initial energy supply for the apparatus with the circuit breaker open by impressing a current flow via the photovoltaic string and drawing energy from the impressed current flow via the string,
   transmitting a switch-on signal via the photovoltaic string, and
   closing the circuit breaker of the apparatus in reaction to the transmitted switch-on signal,
   wherein energy is supplied to the apparatus after the closing of the circuit breaker by energy being drawn from the current flow via the string,
   wherein impressing the current flow comprises impressing a reverse current via the string.

10. The operating method as claimed in claim 9, wherein impressing the current flow additionally comprises applying an AC voltage having a first frequency.

11. The operating method as claimed in claim 9, wherein after closing the circuit breaker of the apparatus,
   transmitting a live signal repeatedly or permanently via the photovoltaic string, and wherein the circuit breaker remains closed as long as the live signal is transmitted, and opening the circuit breaker upon the live signal being discontinued.

12. The operating method as claimed in claim 11, wherein transmitting the live signal comprises applying an AC voltage having a second frequency different from the first frequency.

13. The operating method as claimed in claim 11, wherein transmitting the live signal comprises applying an AC voltage having a second frequency equal to the first frequency.

* * * * *